United States Patent
Moehlmann et al.

(10) Patent No.: US 11,817,869 B2
(45) Date of Patent: Nov. 14, 2023

(54) SYSTEM AND METHOD OF CONTROLLING FREQUENCY OF A DIGITALLY CONTROLLED OSCILLATOR WITH TEMPERATURE COMPENSATION

(71) Applicant: NXP B.V., Eindhoven (NL)

(72) Inventors: Ulrich Moehlmann, Moisburg (DE); Steffen Rode, Lüneburg (DE); Ralf Gero Pilaski, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/696,579

(22) Filed: Mar. 16, 2022

(65) Prior Publication Data

US 2023/0299777 A1   Sep. 21, 2023

(51) Int. Cl.
*H03L 7/099* (2006.01)
*H03L 7/093* (2006.01)

(52) U.S. Cl.
CPC ............ *H03L 7/0992* (2013.01); *H03L 7/093* (2013.01); *H03L 2207/50* (2013.01)

(58) Field of Classification Search
CPC ..... H03L 7/081; H03L 7/0812; H03L 7/0814; H03L 7/085; H03L 7/089; H03L 7/0891; H03L 7/0893; H03L 7/093; H03L 7/095; H03L 7/099; H03L 7/0991
See application file for complete search history.

(56) References Cited

U.S. PATENT DOCUMENTS 9,893,876 B2 *  2/2018  Moehlmann .......... H04L 7/0331
10,187,069 B2 * 1/2019  Möehlmann ............ H03L 7/095
2007/0085621 A1   4/2007  Staszewksi et al.
2013/0278347 A1  10/2013  Li
2016/0036454 A1   2/2016  Moehlmann

FOREIGN PATENT DOCUMENTS

WO   WO 2011149657 A    12/2011
WO   WO 2013149636 A    10/2013

OTHER PUBLICATIONS

Okuno, Keisuke et al. "Temperature Compensation Using Least Mean Squares for Fast Settling All-Digital Phase-Locked Loop." © 2013 IEEE. Downloaded on May 25, 2021 from IEEE Xplore. pp. 1-4.
K. Okuno et al.: "A 2.23 ps RMS jitter 3 [mu]s fast settling ADPLL using temperature compensation PLL contro", 21st IEEE International Conference on Electronics, Circuits and Systems (ICECS), p. 68-71, Dec. 7, 2014.

* cited by examiner

*Primary Examiner* — Diana J. Cheng

(57) ABSTRACT

A control system for a digitally controlled oscillator with temperature compensation including a loop detector providing an error value, filter circuitry providing a lower resolution digital value to the DCO to generate an output oscillation signal at a frequency within a lower resolution range, tracking circuitry holding a tracking digital value at a tracking offset from center of a tracking range while the lower resolution digital value is being determined, and then regulating the frequency within a higher resolution range by adjusting the tracking digital value, temperature compensation circuitry performing temperature compensation steps to maintain the tracking digital value between first and second thresholds within the predetermined tracking range, and a controller configured to set the first and second thresholds within a narrow range around the tracking offset during a standard operating mode, and to adjust one or both thresholds within a wide range during a critical operating mode.

19 Claims, 7 Drawing Sheets

SYSTEM AND METHOD OF CONTROLLING FREQUENCY OF A DIGITALLY CONTROLLED OSCILLATOR WITH TEMPERATURE COMPENSATION

FIELD OF THE INVENTION

Background

The present disclosure relates in general to controlling digitally controlled oscillators, and more specifically to a system and method of controlling a digitally controlled oscillator with temperature compensation.

Description of the Related Art

Various types of signal generators are known for generating oscillation signals including clock signals and the like. One type of signal generator is an all-digital phase locked loop (ADPLL) incorporating and controlling operation of a digitally controlled oscillator (DCO) for generating oscillation signals in the gigahertz (GHz) frequency range. DCOs, however, often exhibit a temperature drift so that the ADPLL incorporates a control loop that is intended to remain locked in spite of significant temperature changes. Control methods may be used to measure the frequency or phase difference and adjust for variations including a temperature control mechanism responsive to temperature drift. Some methods may apply compensation that re-centers tracking range when a change in temperature exceeds a predetermined offset. Circuit mismatches often cause a frequency or phase glitch in the output oscillation signal for each compensation step.

Frequency or phase glitches are not desired or can even be harmful if the output oscillation signal is used for critical timing functions, such as, for example, a sample clock for an analog to digital converter (ADC) in which such glitches may degenerate the performance of the sampled signal. Frequency or phase glitches may also be undesirable when the output oscillation signal is used as the reference clock for a communication system, such as, for example, a wired or wireless radio frequency (RF) communication system used in sonar, radar, or laser systems and the like. A radar system generating chirp signals, which have a frequency that may vary linearly with time, may become corrupted and unusable causing a substantial negative impact on overall system performance.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

Embodiments described herein disclose a system and method for controlling a digitally controlled oscillator (DCO) with temperature drift, such as an all-digital phase locked loop (ADPLL) incorporating and controlling operation of a DCO. An ADPLL as described herein includes one or more filters that may be locked when a tracking value of a tracking filter is at an adjustable offset relative to the center of a tracking range of a tracking filter. Furthermore, thresholds of the drift compensation are changed from tight settings around the operation point at the offset to values close to the operation limit of the tracking range of the tracking value. The offsets are chosen so that the tracking filter can handle the complete temperature operation range of the system without the need of drift compensation activities during critical modes of operation. In addition, the ADPLL filter and tracking filters can be re-biased again in case the temperature changes are larger than the range the tracking filter can handle. The DCO may be implemented with a capacitor bank or an array of current digital to analog converters (DACs) or the like controlled by the filters for controlling frequency of an output oscillation signal.

The biasing and possible re-biasing are performed during a standard system operating mode when drift compensation updates with possible phase or frequency disturbances are relatively inconsequential or at least tolerable. When the system is operating in a high performance or critical mode sensitive to such disturbances, however, drift compensation updates are avoided. System software interaction may be used to identify desired frequency of operation and operating mode. The software is programmed to identify standard operating modes that allow drift compensation activities and critical operating modes which do not allow compensation activities.

Furthermore, the software may track temperature and expected temperature behavior so that temperature drift compensation events are avoided during the critical operating modes. If the overall tracking range of the tracking value is large enough to cover temperature changes after system warm up, there may be no need to re-bias. On the other hand, if the tracking filter is about to approach the end of the operation range, drift compensation may be used to keep the ADPLL system in lock, or the ADPLL system may re-biasing the tracking range offset, or a combination of both methods may be employed.

Figure 1:
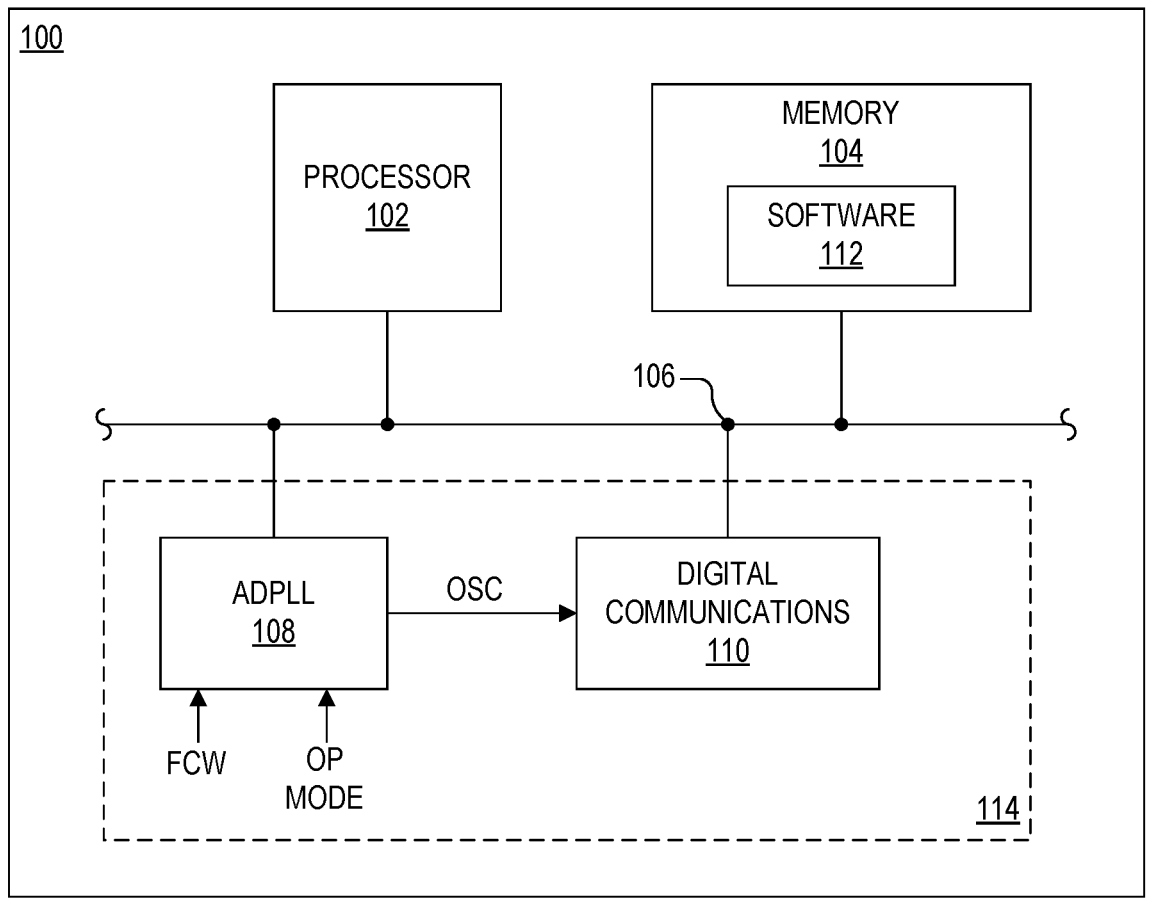
FIG. 1 is a simplified block diagram of a processing system implemented according to one embodiment of the present disclosure.

FIG. 1 is a simplified block diagram of a processing system 100 implemented according to one embodiment of the present disclosure. The processing system 100 may be implemented to perform any one or more of many different processing functions. In one embodiment, for example, the processing system 100 may be configured as a communication system for performing various communication functions, such as wired or wireless radio frequency (RF) communications or the like used in sonar, radar, or laser systems and the like. The illustrated processing system 100 includes a processor 102 and a memory 104 coupled together to communicate with each other via a bus 106 which is implemented according to any bus, bus system or any other suitable type of communication interface. Also coupled to the bus 106 is an all-digital phase-locked loop (ADPLL) 108 and digital communications circuitry 110.

The processor 102 may be implemented as any type of processing device, processing circuit, processing core, central processing unit (CPU), microprocessor, microcontroller or microcontroller unit (MCU), etc. The memory 104 may include any combination of read-only memory (ROM) or random-access memory (RAM) for storing applications, software, code, or other data and information for use by the processor 102. As shown, the memory 104 stores software 112 that is executed by the processor 102 for performing or otherwise controlling many of the functions of the processing system 100.

The ADPLL 108 generates an oscillation (OSC) signal which is provided to the digital communications circuitry 110. OSC may have any suitable format, such as a sine-wave signal or a square-wave signal or the like, and may be used directly or converted for use as synthesizer signal, or as a local oscillator (LO) signal for a tuner (not shown), or as a clock signal for clocking an analog to digital converter (ADC), or any combination thereof. The software 112, when executed by the processor 102, communicates to the ADPLL 108 one or more parameters, such as including a frequency control word (FCW), for controlling the frequency of OSC as further described herein. The OSC signal may be driven to any one of multiple frequency levels depending upon the operating mode, including one or more frequencies in the gigahertz (GHz) range. The FCW value may be programmed into a memory location or a register or the like. The software 112 may also communicate to the ADPLL 108 an operating mode (OP MODE) value indicating any one of several operating modes as further described herein. Although various different operating modes may be indicated, the operating modes at least include a standard operating mode (SM) for performing general functions, and a critical operating mode (CM) for high performance communication functions. In one embodiment, the software 112 anticipates entering the critical operating mode and indicates the CM mode just before CM mode is actually entered, so that the ADPLL 108 may adjust operation to avoid compensation updates during the CM mode. The software 112 indicates the SM mode when CM mode operations are complete.

In one embodiment, the digital communications circuitry 100 is implemented to perform radio frequency (RF) communications including generating "chirp" signals or the like. Chirp signals are commonly used in sonar, radar, or laser systems or the like having a frequency that may vary linearly with time. Chirp signals are used during the CM operating mode and do not tolerate any significant disturbances of phase or frequency of the OSC signal. The digital communications circuitry 110 may include circuitry for performing other types of functions, such as a digital signal processor (DSP), ADCs or digital to analog converters (DACs), local oscillator (LO) signal generators, high speed interfaces, etc.

The processing system 100 may be configured as a system on a chip (SoC) or the like in which each of the devices and components are provided on a single integrated circuit (IC). Alternatively, the devices and components may be discretely implemented in which some of the blocks, such as the ADPLL 108 and the digital communications circuitry 110, may be implemented on a separate IC 114. In general operation as described further herein, heat generated by the digital communications circuitry 110 or other circuitry (not shown) is conducted to the ADPLL 108 causing a temperature drift that causes a drift of the center frequency of OSC which changes an operation point of the ADPLL 108. The ADPLL 108 incorporates temperature compensation to keep the operation point within desired limits established by the software 112. In one embodiment, such temperature compensation occurs in compensation steps as the temperature changes over time in which the frequency or phase glitches may exhibit disturbances. Such disturbances may be tolerated during the SM mode in which such glitches are inconsequential to overall operation of some circuitry, such as DSPs or lower frequency local oscillator generators and the like. Such disturbances are problematic, however, during the CM mode in which frequency or phase glitches may substantially impact performance in a negative manner. The ADPLL 108 is implemented to avoid compensation steps during the CM mode as further described herein.

Figure 2:
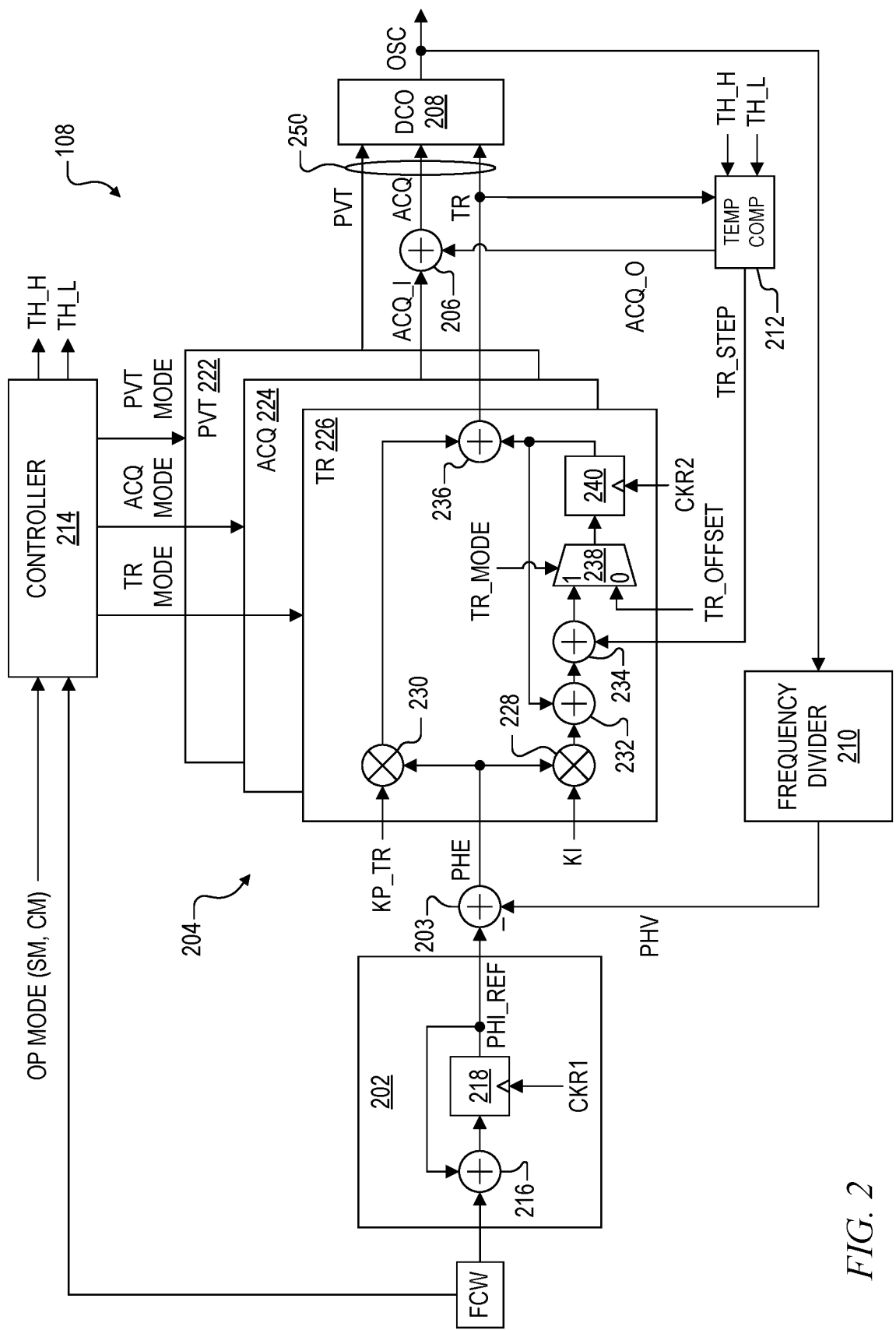
FIG. 2 is a simplified schematic and block diagram of the ADPLL of FIG. 1 implemented according to one embodiment of the present disclosure.

FIG. 2 is a simplified schematic and block diagram of the ADPLL 108 implemented according to one embodiment of the present disclosure. The ADPLL 108 includes an integrator 202, a phase detector (PD) 203, a digital loop filter 204, an adder 206, a digitally controlled oscillator (DCO) 208, a frequency divider 210, temperature compensation circuitry 212, and a controller 214. The integrator 202 has an input receiving the FCW value and the controller 214 receives FCW and the OP MODE value. In the illustrated embodiment, the integrator 202 includes an adder 216 and a register 218 clocked by a first reference clock CKR1. CKR1 may be developed by OSC and may be a frequency divided version thereof. The FCW value is provided to one input of the adder 216, having an output provided to an input for loading the register 218. The register 218 has an output providing a phase reference signal PHI_REF that is fed back to the other input of the adder 216 and that is provided to a positive input of the PD 203. The PD 203, which may be configured as an adder or a quantizer or the like, has an output providing a phase error signal PHE to an input of the digital loop filter 204. Although the PD 203 is configured as a phase detector for comparing phase for controlling the loop, it is understood that PD 203 is just one type of loop detector in which other types of loop detector may be used for comparing the same or different loop parameters for controlling the loop.

The digital loop filter 204 includes a process, voltage, and temperature (PVT) filter 222 for generating a digital PVT value, an acquisition (ACQ) filter 224 for generating an initial digital ACQ_I value, and a tracking (TR) filter 226 for generating a tracking value TR. Although not specifically shown in FIG. 2, PHE may be provided to corresponding inputs of the PVT filter 222 and the ACQ filter 224. The ACQ_I value is provided to a first input of the adder 206, which has a second input receiving an offset ACQ value ACQ_O, and which has an output providing a corresponding ACQ value. The PVT, ACQ and TR values are provided to respective inputs of the DCO 208, which has an output providing the OSC signal having a frequency controlled by the collective values of PVT, ACQ, and TR. The OSC signal is fed back to an input of the frequency divider 210, which has an output providing a feedback phase value PHV to a negative input of the PD 203. The PD 203 converts (via subtraction or quantization or the like) PHI_REF with PHV to generate the phase error signal PHE provided to the digital loop filter 204.

The TR filter 226 of the digital loop filter 204 includes digital multipliers 228 and 230, digital adders 232, 234, and 236, a 2-input multiplexor (MUX) 238, and a register 240 clocked by a second reference clock signal CKR2. CKR2 may be also developed by OSC and may be a frequency divided version thereof, and CKR1 and CKR2 may be the same clock signal in some embodiments or different signals in other embodiments. The phase error signal PHE is provided to respective inputs of the multipliers 228 and 230. A first loop control parameter KI is provided to another input of the multiplier 228, which has an output coupled to one input of the adder 232. The output of the adder 232 is provided to one input of the adder 234, having another input receiving a TR_STEP value and having an output coupled to a logic "1" input of the MUX 238. The MUX 238 has a logic "0" input receiving a TR_OFFSET value, has a select input receiving a TR MODE signal, and has an output coupled to an input of the register 240. The output of the register 240 is coupled to one input of the adder 236 and is fed back to the other input of the adder 232. The multiplier 230 has another input receiving a second loop control parameter KP_TR, and has an output coupled to another input of the adder 236. The adder 236 has an output providing the TR value to the DCO 208.

In the illustrated embodiment, the controller 214 provides an upper threshold value TH_H and a lower threshold value TH_L to respective inputs of the temperature compensation circuitry 212. Alternatively, the controller 214 may indicate the applicable OP MODE (SM or CM) to the temperature compensation circuitry 212, which generates the threshold values TH_H and TH_L. The temperature compensation circuitry 212 has another input receiving the TR value, has a first output providing the ACQ offset value ACQ_O to the other input of the adder 206, and has a second output providing the TR_STEP value to the other input of the adder 234. The controller 214 provides a PVT MODE signal to the PVT filter 222, provides an ACQ MODE signal to the ACQ filter 224, and provides the TR MODE signal to the TR filter 226 including the select input of the MUX 238.

In operation of the ADPLL 108, when the FCW value is first provided or subsequently updated by the software 112 during the SM mode, the controller 214 receives FCW, negates (or clears) the TR MODE and ACQ MODE signals, and asserts the PVT MODE signal to initiate operation of the PVT filter 222. When ACQ MODE is cleared (e.g., to zero), ACQ_I is asserted to an initial digital value. In one embodiment, the ACQ values (ACQ_I, ACQ_O, and ACQ) are signed digital values in which are each initially reset to zero, which in signed notation means that the values are centered within a controlling range. The TR MODE value is initially zero so that the TR_OFFSET value is selected by the MUX 238 as the TR value so that loop operation of the TR filter 226 is temporarily bypassed.

The PVT filter 222 generally has a relatively coarse resolution to cover initial process, voltage, and temperature values to coarsely adjust the frequency of the OSC signal to reduce the phase error signal PHE within its resolution range. In one embodiment for OSC having a frequency in the GHz range, PVT may have a step size (e.g., resolution) of about 10 to 20 Megahertz (MHz) per least-significant bit (LSB) of PVT. Once the PVT filter 222 controls PVT to within its resolution range, the PVT value may be locked. Thus, PVT is locked once the frequency of the OSC signal relative to the target frequency established by the FCW value is within the resolution range of the PVT filter 222, such as within 10 to 20 MHz/LSB.

After the PVT value is locked, the controller 214 asserts ACQ MODE to initiate operation of the ACQ filter 224. The ACQ filter 224 generally has an intermediate resolution range to further adjust the frequency of the OSC signal to reduce the phase error signal PHE within its resolution range. In one embodiment for the frequency of OSC in the GHz range, ACQ may have a step size (e.g., resolution) of about 0.5 to 1 MHz/LSB. Once the ACQ filter 224 controls ACQ_I and thus the initial ACQ value to within its resolution range, the ACQ_I value may be locked. Thus, ACQ_I may be locked once the frequency of OSC relative to the target frequency established by the FCW value is within the resolution range of the ACQ filter 224, such as within 0.5 to 1 MHz/LSB.

After the PVT and ACQ_I values are locked, the controller 214 asserts TR MODE to initiate operation of the TR filter 226. In addition, if not already set, the controller 214 asserts the TH_H and TH_L threshold values above and below, respectively the TR_OFFSET value. It is noted that the PVT and ACQ_I values were locked while the TR value was held at TR_OFFSET. When TR MODE is asserted, the MUX 238 is switched from TR_OFFSET to loop control of the TR filter 226 to further adjust the frequency of OSC to reduce the phase error signal PHE within the overall range of the TR value. In one embodiment for the frequency of the OSC signal in the GHz range, the TR value may have a step size (e.g., resolution) of about 20 to 40 kilohertz (kHz) per LSB. In this manner, the TR filter 226 continuously adjusts the TR value to maintain the frequency of the OSC signal within the overall tracking range of the TR value of the TR filter 226, such as within 20 to 40 kHz/LSB. In addition, the TH_H and TH_L threshold values are initially set to form a relatively narrow range on either side of the TR_OFFSET value to keep the TR value at or near TR_OFFSET. The TR_OFFSET value is asymmetrically positioned within the overall range of the TR value, such as nearer to a minimum TR value or a maximum TR value. In one embodiment in which TR is increased with rising temperature, for example, the TR_OFFSET value may be positioned at a lower end (or negative range) of the TR value as further described herein.

As previously described, after start-up of the processing system 100, heat generated within the processing system 100 or on the IC 114 heats up the ADPLL 108 causing temperature drift. The TR filter 226 incrementally increases the TR value with rising temperature to maintain relatively constant frequency and to keep the ADPLL 108 locked. The overall range of the TR value, however, is limited and not large enough to compensate for the entire temperature range during operation. Although it would be possible to extend the tracking range the TR value, such implementation would be inefficient and costly. To avoid an excessively large tracking range of the TR value to cover the entire operating temperature range of the system while the ADPLL 108 is locked, temperature drift compensation is implemented. The temperature drift compensation exchanges the ACQ and TR values in a complementary manner, in which the TR_STEP value provided by the temperature compensation circuitry 212 is a signed value having a magnitude equivalent to a single ACQ step so that the frequency of OSC is kept relatively constant.

In one embodiment, for example, one ACQ step is equivalent to M steps of the TR value, so that the TR_STEP value has a magnitude of M. In a particular embodiment, M is empirically determined, such as at or near 50. When ACQ is incremented by one, TR_STEP is set equal to −M to reduce the TR value by M to maintain the same frequency level. In similar manner, when ACQ is decremented by one, TR_STEP is set equal to M to increase the TR value by M to maintain the same frequency level. In one embodiment, the TR_STEP value is cleared after one cycle of CKR2. In an alternative embodiment, the temperature compensation circuitry 212 clears the TR_STEP value upon detecting that the TR value has been increased by M.

In operation of the temperature compensation circuitry 212 for drift compensation, when the TR value rises above TH_H, ACQ_O is incremented by 1 so that ACQ is incremented accordingly, whereas TR is reduced by TR_STEP at the same time to maintain frequency and the locked condition. This process is repeated while the temperature rises so that TR remains within the narrow range between TH_H and TH_L. It is noted that operation is similar in the reverse direction, so that if the temperature drops such that the TR value drops below TH_L, ACQ is decremented and TR is increased by TR_STEP at the same time to maintain the same frequency. Although TR and ACQ are adjusted in an equivalent or complementary manner to avoid an abrupt change of the frequency of OSC, each compensation step causes either a frequency glitch, or a phase glitch, or both due to filter mismatches and limitations in the loop. Such phase or frequency glitches are tolerated during the SM operating standard mode. During the CM critical operating mode, however, such phase or frequency glitches may substantially degrade performance and thus should be avoided.

As further described herein, when the software 112 switches OP MODE from SM to CM to inform the ADPLL 108 of impending high-performance operation, the controller 214 changes one or both of the thresholds TH_H and TH_L to significantly widen the operating range of the TR value while avoiding or minimizing temperature compensation steps. In the alternative embodiment previously described, the controller 214 may indicate the mode change to the temperature compensation circuitry 212, which adjusts the TH_H and TH_L thresholds accordingly. Since TR_OFFSET initially asymmetrically places the TR value at one end (e.g., a lower end) of the overall range of TR, and since one or both TH_H and TH_L are adjusted to significantly widen the operating range of the TR value without requiring compensation, such frequency or phase glitches are avoided during the CM operating mode. When the software 112 indicates that operation is reverted back to the SM operating mode, one or both TH_H and TH_L are re-adjusted back to the narrow range within which the TR value operates to re-bias the ADPLL 108 for subsequent CM operating mode.

The PVT, ACQ and TR values collectively form a digital control value 250 provided to the DCO 208 for controlling the frequency of the output signal OSC. In one embodiment, these digital values are independent with different resolution and controlling range. The operation point of PVT determines the resolution controlling range of ACQ and TR. It is noted that the range of ACQ may cover several PVT steps and that the range of TR may cover several ACQ steps. PVT represents the most significant bits for achieving lower resolution, ACQ represents intermediate significant bits for achieving intermediate resolution, and TR represents the least significant bits for achieving higher resolution.

Figure 4:
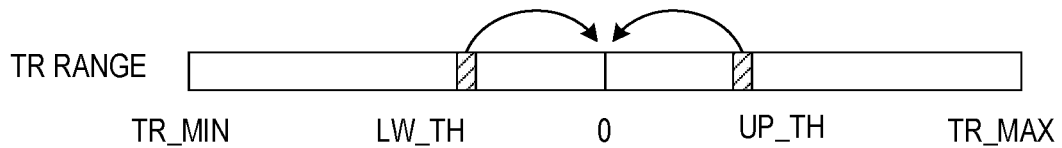
FIG. 4 is a simplified diagram of the overall range of the TR value and possible temperature drift compensation operation.

It is noted that "TR" generally denotes tracking functions performed by the TR filter 226 for generating and updating the digital tracking value TR provided to the DCO 208 for controlling the frequency of OSC. The TR value has an overall range, such as between TR_MIN and MAX (e.g., as shown in FIG. 4) and may be a signed or unsigned digital value. The controller 214 provides the TR MODE signal for controlling the operating mode of the TR filter 226. When the TR MODE signal is initially logic zero "0" while the PVT and ACQ_I values are being locked, the TR value (tracking digital value) is initially held at the offset value TR_OFFSET so that the ADPLL 108 is locked asymmetrically in the overall range of the TR value. After lock is completed and the controller 214 asserts the TR MODE signal to logic one "1", the TR filter 226 is effectively placed in the feedback loop of the ADPLL 108 to perform tracking functions by adjusting the TR value to adjust the frequency of OSC. The operating range of the TR value during tracking, however, is limited between the threshold values TH_L and TH_H. ACQ_O and TR_STEP are used by the temperature compensation circuitry 212 to adjust ACQ and TR, respectively, in a complementary manner for each temperature compensation step to maintain the TR value within the thresholds TH_L and TH_H.

Figure 3:
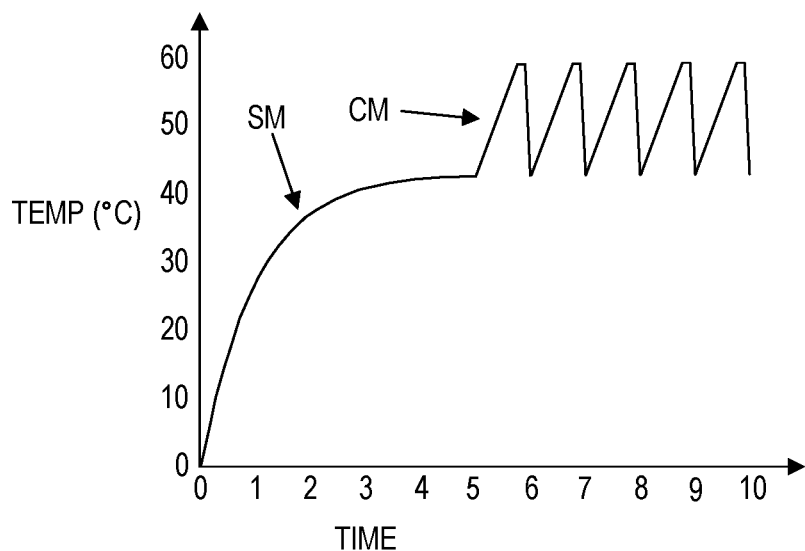
FIG. 3 is an idealized graphic diagram plotting temperature versus time for the ADPLL of FIG. 2 according to one embodiment.

FIG. 3 is an idealized graphic diagram plotting temperature in ° C. versus time for the ADPLL 108 according to one embodiment. At a beginning time 0, temperature is low such as at 0° C. After startup and during SM operating mode, temperature rises and reaches a steady-state temperature level, such as at or near 40° C. Operation then switches to the CM operating mode in which the digital communications circuitry 110 conducts multiple sequential high performance communication cycles. During each cycle, temperature quickly rises to almost 60° C. in a relatively short period of time, then remains steady for a short period of time, and then quickly drops back to steady-state temperature of about 40° C. Each sequential cycle begins almost immediately and the cycles repeat multiple times during the CM operating mode.

FIG. 4 is a simplified diagram of the overall range of the TR value and possible temperature drift compensation operation. The overall range of the TR value, or TR range, ranges from a minimum value TR_MIN to a maximum value MAX. The TR value may be signed digital value centered at a zero (0) value as shown. Alternatively, the TR value may be an unsigned digital value. In this compensation operation, when the TR value rises to an upper threshold UP_TH or falls to a lower threshold value LW_TH, TR is reset back to zero in the middle of the TR range. Such compensation operation would be performed during both SM and CM modes of operation when using this type of temperature drift compensation.

Figure 5:
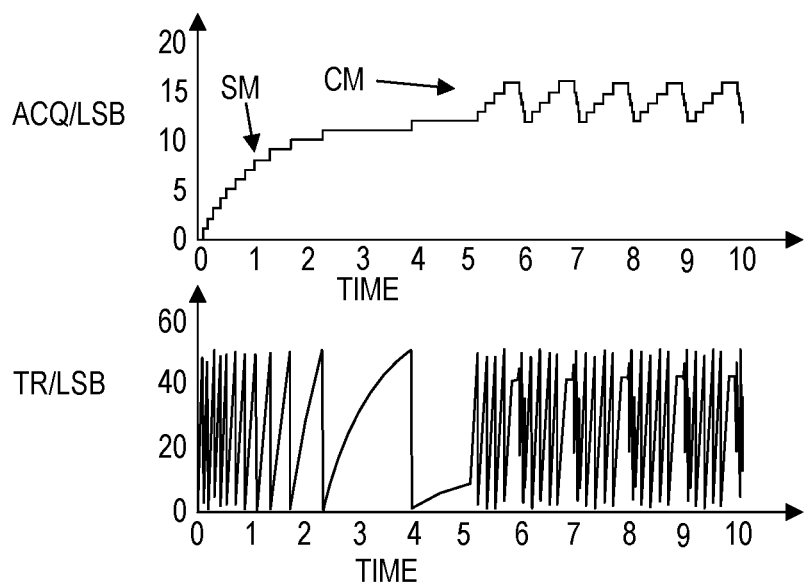
FIG. 5 shows a pair of simplified graphic diagrams illustrating corresponding temperature drift compensation.

FIG. 5 shows a pair of simplified graphic diagrams plotting ACQ/LSB and TR/LSB, respectively, versus normalized time illustrating operation based on the temperature drift compensation operation shown in FIG. 4. During both the SM and CM operating modes, ACQ is successively incremented (or decremented) while TR is successively reset back to zero. Such operation is tolerable during the SM operating mode when frequency or phase glitches may be tolerated. Such operation is problematic, however, during the CM operating mode in which frequency or phase glitches significantly impair communication operation. As shown, multiple compensation steps occur during each CM cycle while temperature is quickly rising. Such frequency or phase glitches are not desired and can even be harmful if the OSC signal is used as a sample clock for an ADC and if the phase or frequency glitches degenerate the performance of the sampled signal. In case of a radar system, complete chirp signals can be degraded and significantly degrade communications operation.

Figure 6:
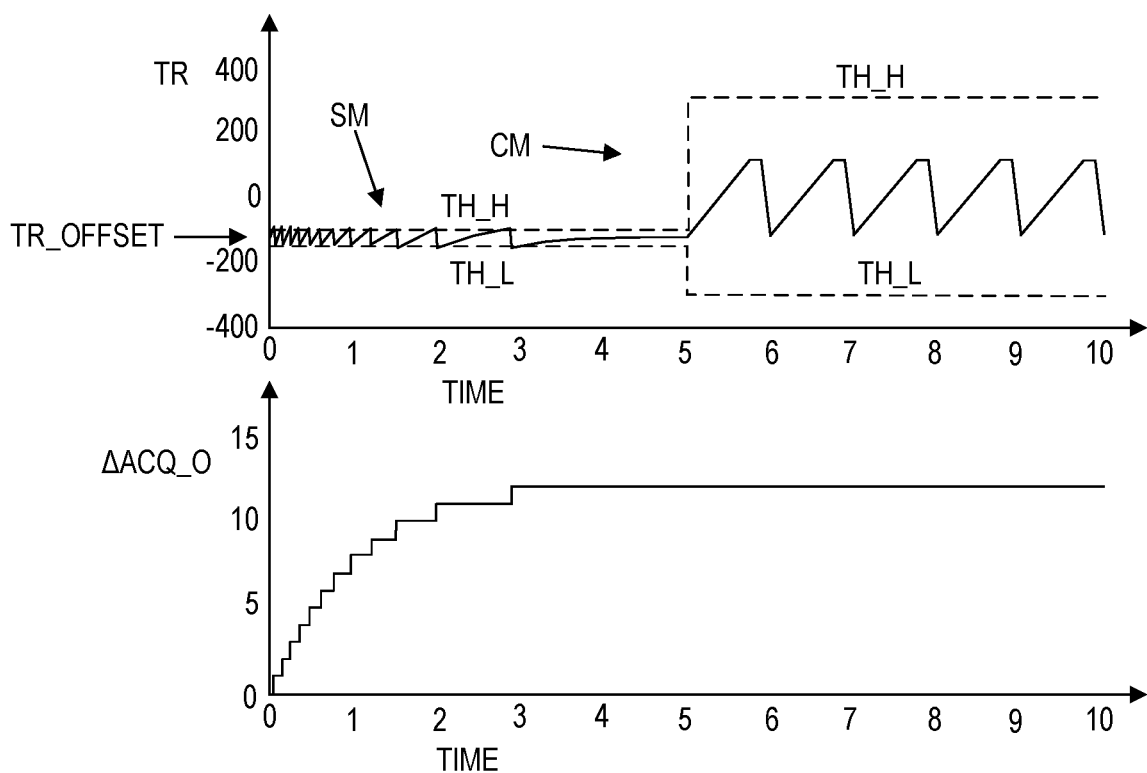
FIG. 6 shows a pair of simplified graphic diagrams plotting TR and ACQ_O, respectively, versus time illustrating startup operation of the ADPLL of FIG. 2 including initial standard and critical modes of operation according to one embodiment of the present disclosure.

FIG. 6 shows a pair of simplified graphic diagrams plotting the TR value and ΔACQ_O, respectively, versus time illustrating startup operation of the ADPLL 108 including initial SM and CM modes of operation according to one embodiment of the present disclosure. TH_H and TH_L are also plotted together with the TR value using dashed lines. It is noted that ΔACQ_O simply represents a relative change of ACQ_O. In this example, the TR value is shown having an overall range from a minimum digital value of −400 to a maximum digital value of 400. In this case, TR_OFFSET has a value of −125 so that the TR value is initially set asymmetrically within its overall range. Also, TH_H is initially set at about −100 and TH_L is initially set at about −150. In this manner, TH_H and TH_L are initially set with a narrow range separated by about one TR_STEP during the SM operating mode. It is noted that the narrow range may have a different value, such as slightly larger than one TR_STEP. At an initial time 0 just after the ADPLL 108 has locked both the PVT and ACQ_I values, the TR value starts at about TR_OFFSET. As time progresses and temperature increases, for each compensation step, the TR value successively rises to TH_H and is then reduced by TR_STEP back down to about TH_L, while ACQ_O is incremented. In this manner, TR toggles between TH_H and TH_L while ACQ_O incrementally rises during the SM operating mode.

At a subsequent time 5, CM mode is indicated by the software 112 and the controller 214 adjusts the TH_H and TH_L thresholds into a wider range. In the illustrated embodiment, TH_H is increased to about 300 while TR_L is decreased to about −300, providing an overall TR operating range of 600 steps. During the CM operating mode, TR rises and falls between 100 and −100 providing a relatively large margin between TH_H and TH_L. Since TR does not reach either of the threshold levels TH_H or TH_L, no compensation steps are performed during the CM operating mode. In this manner, frequency and phase glitches are avoided and optimal performance may be achieved during CM. The wider threshold margins allow relatively large variations in temperature without necessitating compensation.

It is noted that the TR value may have a signed digital value that ranges within a predetermined tracking range between a negative minimum tracking value and a positive maximum tracking value with an intermediate zero tracking value. In the illustrated embodiment of FIG. 6, the negative minimum tracking value is −400 and the positive maximum tracking value is +400, although these particular values are arbitrary and different minimum and maximum values may be defined in different configurations. Also, TR_OFFSET is a predetermined tracking offset having a negative tracking value between the negative minimum tracking value and the intermediate zero tracking value. In this case, TR_OFFSET asymmetrically places TR in the negative range of the overall range of the TR value to allow for temperature increase. In alternative embodiments in which temperature is expected to decrease, TR_OFFSET may alternatively asymmetrically place TR in the positive range of the overall range of TR to allow for temperature decrease. In either case, TH_H and TH_L are values just above and below, respectively, TR_OFFSET when in the narrow tracking range. When switched to the wide tracking range during the CM operating mode, at least TH_H is adjusted to a positive value in one embodiment. In the illustrated embodiment of FIG. 6, when switched to the wide tracking range during the CM operating mode, TH_H is adjusted to a positive value near the positive maximum tracking value and TH_L is adjusted to a third negative value near the negative minimum tracking value to maximize the available TR range with suitable positive and negative margins.

Figure 7:
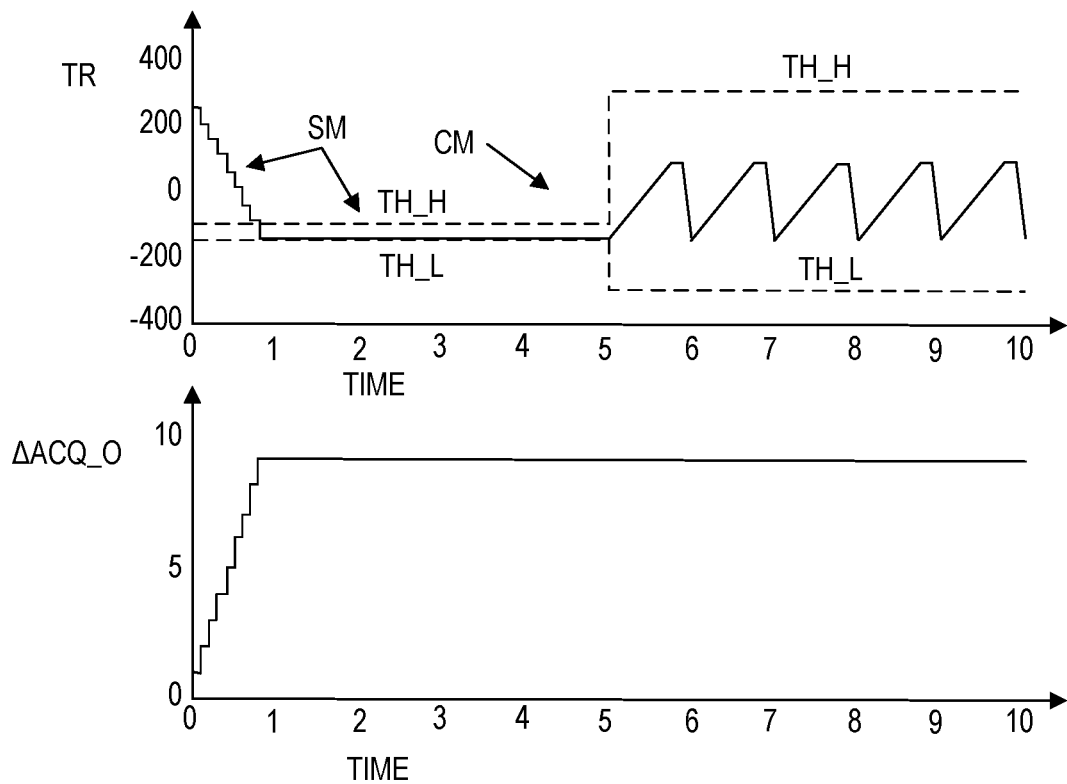
FIG. 7 shows a pair of simplified graphic diagrams plotting TR and ΔACQ_O, respectively, versus time illustrating re-biasing operation of the ADPLL of FIG. 1 including subsequent standard and critical operating modes according to one embodiment of the present disclosure.

FIG. 7 shows a pair of simplified graphic diagrams plotting TR and ΔACQ_O, respectively, versus time illustrating re-biasing operation of the ADPLL 108 including subsequent SM and CM operating modes according to one embodiment of the present disclosure. Again, ΔACQ_O simply represents a relative change of ACQ_O, and TH_H and TH_L are plotted together with TR using dashed lines. After a previous CM operating mode (not shown), TR may be at a relatively high value, such as 300 as shown, whereas ACQ_O is at an arbitrary level, shown as ΔACQ 0=0. At an initial time 0, operation switches back to the SM operating mode and TR_STEPs down back towards TH_L while ΔACQ_O incrementally increases for each compensation step. When TR falls to TH_L and ΔACQ_O rises to 9, both are shown remaining steady since temperature has stabilized and is not changing. Of course, if temperature changes for any reason causing changes of TR, then TR would toggle between TH_L and TH_H as previously described.

At a subsequent time 5, CM mode is indicated by the software 112 and the controller 214 adjusts the TH_H and TH_L thresholds to a wide range in the same manner as described for FIG. 6. Again, in the illustrated embodiment, TH_H is increased to about 300 while TR_L is decreased to about −300, providing an overall TR operating range of 600 steps. During the CM operating mode, TR again rises and falls between 100 and −100 providing a relatively large margin between TH_H and TH_L. Since TR does not reach either of the threshold levels TH_H or TH_L, no compensation steps are performed during the CM operating mode. In this manner, frequency and phase glitches are avoided and optimal performance may be achieved during CM.

Figure 8:
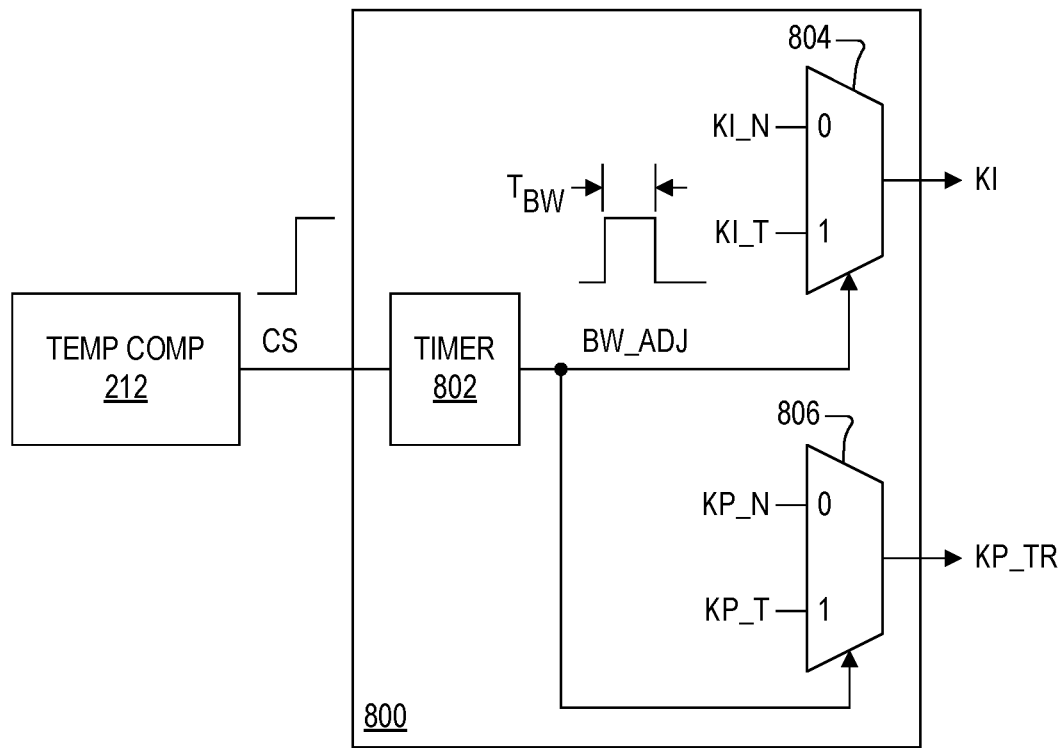
FIG. 8 is a simplified schematic and block diagram of bandwidth control circuitry that may be included within the ADPLL of FIG. 2 for adjusting loop control bandwidth during each compensation step according to one embodiment of the present disclosure.

FIG. 8 is a simplified schematic and block diagram of bandwidth control circuitry 800 that may be included within the ADPLL 108 for adjusting loop control bandwidth during each compensation step according to one embodiment of the present disclosure. The bandwidth control circuitry 800 includes a timer 802 and a pair of MUXes 804 and 806. In this case, the temperature compensation circuitry 212 is configured to provide a compensation step (CS) signal each time TR crosses either threshold TH_H or TH_L. CS is provided to an input of the timer 802, which outputs a bandwidth adjust (BW_ADJ) signal to the select input of each of the MUXes 804 and 806. MUX 804 has an output providing the loop control parameter KI, and MUX 804 has an output providing the loop control parameter KP_TR. A nominal value KI_N for KI is provided to the "0" input of the MUX 804 and a temporary value KI_T for KI is provided to the "1" input of the MUX 804. A nominal value KP_N for KP_TR is provided to the "0" input of the MUX 806 and a temporary value KP_T for KP_TR is provided to the "1" input of the MUX 806. The nominal values KI_N and KP_N are designed for an optimal or relatively narrow bandwidth of the TR filter 226. The temporary values KI_T and KP_T are designed for an expanded bandwidth of the TR filter 226.

The timer 802 is programmed to assert BW_ADJ for a temporary time period $T_{BW}$ when triggered. The temporary time period $T_{BW}$ has a duration that is predetermined and sufficient to include the compensation step duration.

In operation of the bandwidth control circuitry 800, BW_ADJ has a normal or default logic level of 0 so that MUX 804 selects the nominal values KI_N and KP_N as the KI and KP-Tr parameters, respectively, for normal operation of the TR filter 226. When CS is asserted in response to a compensation step, the timer 802 is triggered to assert BW_ADJ for the temporary time period $T_{BW}$, so that the temporary values KI_T and KP_T are selected as the loop control parameters KI and KP_TR, respectively, to widen the bandwidth of the TR filter 226 during each compensation step. The temporary values KI_T and KP_T are used to widen the bandwidth of the TR filter 226 to minimize amplitude of frequency or phase glitches during each compensation step.

Figure 9:
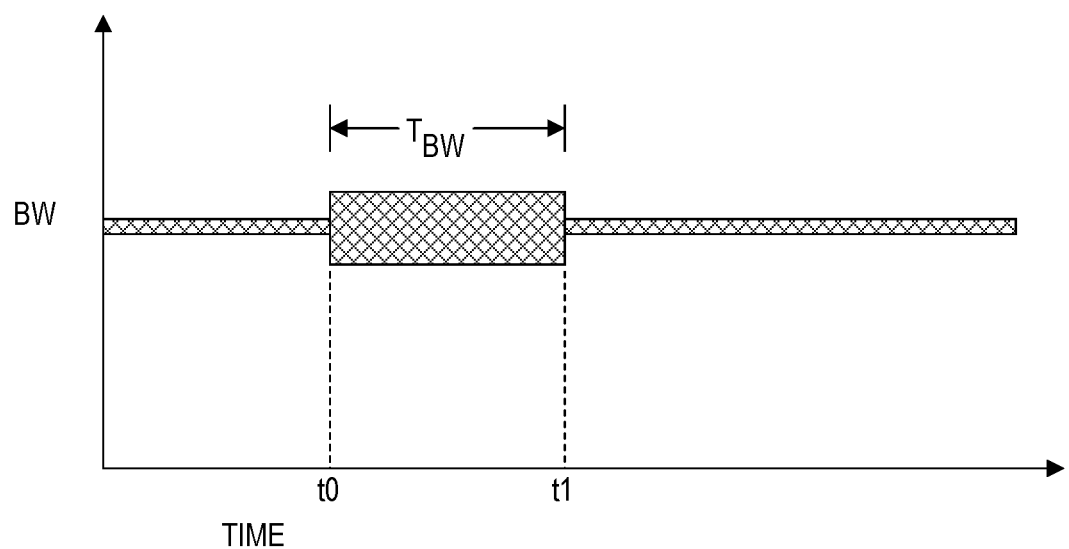
FIG. 9 is a timing diagram plotting relative bandwidth (BW) of the TR filter of FIG. 2 versus time illustrating operation of the bandwidth control circuitry of FIG. 8.

FIG. 9 is a timing diagram plotting relative BW of the TR filter 226 versus time illustrating operation of the bandwidth control circuitry 800 of FIG. 8. Prior to a time t0, the KI_N and KP_N values are selected as the KI and KP_TR parameters, respectively, so that the BW of the TR filter 226 is relatively narrow. At about time t0, CS is asserted and the BW_ADJ signal is asserted for the $T_{BW}$ time period. After time t0, the KI_T and KP_T values are selected as the KI and KP_TR parameters, respectively, so that BW of the TR filter 226 is widened for the time period $T_{BW}$. At subsequent time t1 when $T_{BW}$ expires, operation returns to normal operation in which the KI_N and KP_N values are selected as the KI and KP_TR parameters, respectively, so that the BW of the TR filter 226 again narrowed for normal loop operation.

Figure 10:
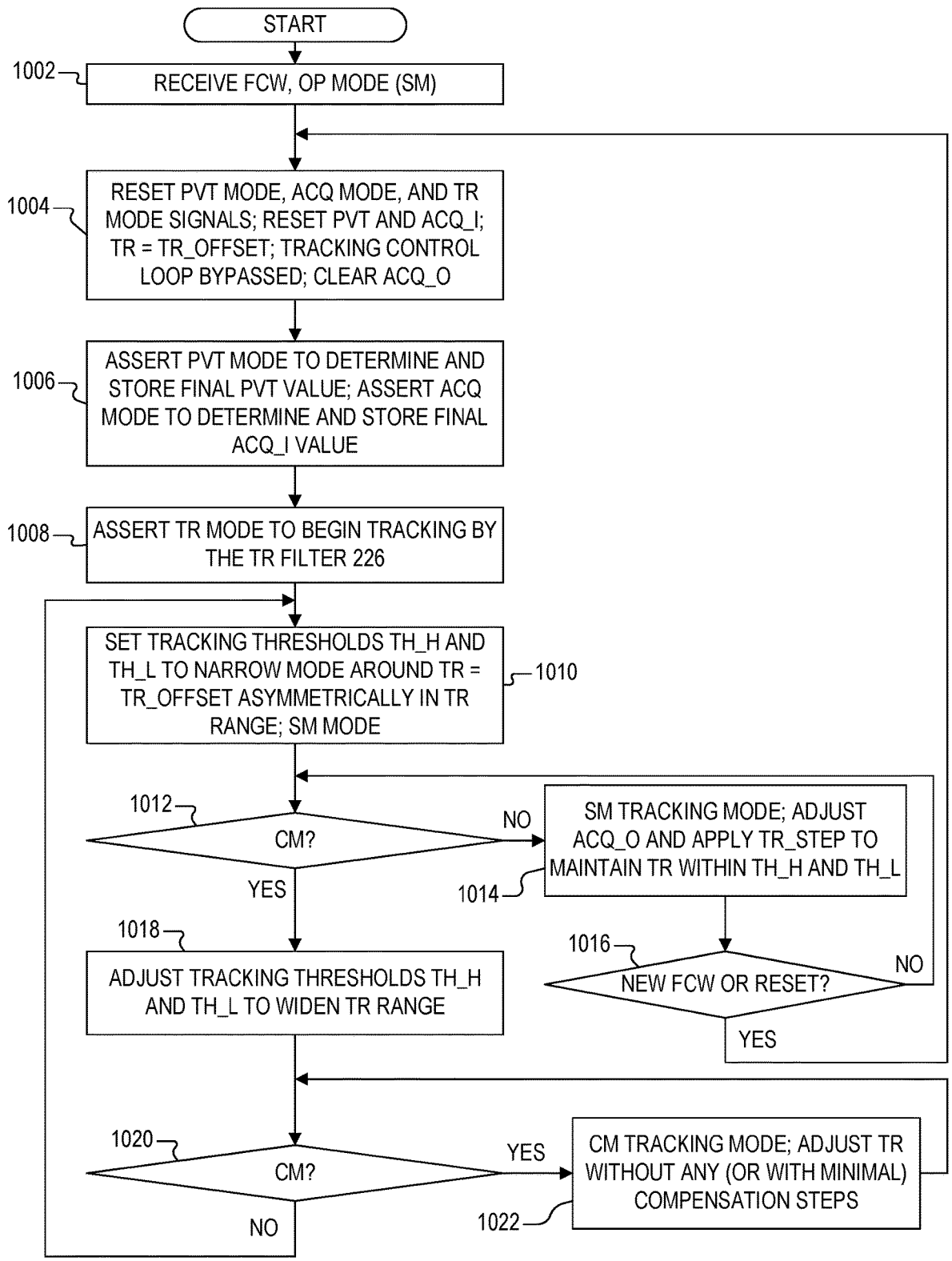
FIG. 10 is a flowchart diagram illustrating operation of the ADPLL of FIG. 2 according to one embodiment of the present disclosure.

FIG. 10 is a flowchart diagram illustrating operation of the ADPLL 108 according to one embodiment of the present disclosure. Operation is mostly controlled by the controller 214 and the temperature compensation circuitry 212. Many of the following blocks or functions described therein may be rearranged without modifying overall operation. At a first block 1002, the FCW and OP MODE values are received, such as provided by the software 112. The OP MODE value may initially be set for the SM mode. At next block 1004, the controller 214 resets or otherwise clears the PVT MODE, ACQ MODE, and TR MODE signals to effectively reset the digital loop filter 204. Clearing the PVT MODE and ACQ MODE signal effectively clears or otherwise resets the PVT and ACQ_I values. Clearing the TR MODE signal causes TR to be set equal to TR_OFFSET and tracking control of the TR filter 226 is effectively bypassed. In addition, the ACQ offset value ACQ_O is cleared or otherwise set to zero.

At next block 1006, PVT MODE is asserted so that the PVT filter 222 determines and stores a final PVT value, and then ACQ MODE is asserted so that the ACQ filter 224 determines and stores a final ACQ_I value. Since ACQ_O is zero, ACQ is initially equal to ACQ_I. TR_OFFSET asymmetrically positions TR within its overall range when PVT and ACQ_I are initially locked. At next block 1008, TR MODE is asserted so that the TR filter 226 switches from holding the TR value at TR_OFFSET to begin tracking and adjusting the TR value based on loop operation. At next block 1010, the tracking thresholds TH_H and TH_L are set to narrow mode around TR=TR_OFFSET in which TR is initially set asymmetrically within the TR range. An example is shown in FIG. 6 in which TR_OFFSET initially places the TR value in the negative (or lower) range of TR. At this time, SM operating mode is active.

At next block 1012, it is queried whether the software 112 has indicated the CM mode operating. If not, operation advances to block 1014 which denotes the SM tracking mode in which a temperature compensation step is performed by adjusting ACQ_O and applying TR_STEP to maintain the TR value within the thresholds TH_H and TH_L. During the SM mode, a temperature compensation step is performed each time TR reaches (e.g., is equal to or greater than) TH_H or when TR reaches (e.g., is equal to or less than) TH_L to maintain frequency while keeping the ADPLL 108 locked. In this case, the temperature compensation circuitry 212 increments ACQ_O and asserts TR_STEP to reduce TR when TR rises above TH_H or otherwise decrements ACQ_O and asserts TR_STEP to increase TR when TR falls below TH_L depending upon temperature changes. It is noted that the temperature compensation steps may occur at a relatively high rate when temperature is rapidly changing given the relatively narrow thresh range. Although frequency or phase glitches may occur for each temperature compensation step, such glitches are tolerated during the SM operating mode. Operation advances to block 1016 to query whether the software 112 has updated the FCW value or if a reset is indicated. If not, operation loops back to block 1012 and operation continues to loop between blocks 1012, 1014, and 1016 in SM mode until the CM mode is indicated or if FCW is updated or reset is indicated. If the FCW value is updated or if reset is indicated, operation loops back to block 1004 to reset the ADPLL 108.

When the software 112 indicates the CM operating mode as determined at block 1012 during the SM operating mode, operation advances to block 1018 in which the controller 214 adjusts the tracking thresholds TH_H and TH_L to widen the TR range, such as illustrated by the graphs of FIGS. 6 and 7. Operation advances to block 1020 in which it is queried whether the CM operating mode remains indicated by the software 112. If so, operation advances to block 1022 for the CM mode in which the TR filter 226 continues operation in the tracking mode to adjust TR but without performing any (or by performing minimal) temperature compensation steps between TR_STEP and ACQ_O. It is noted that it is possible that the temperature may change such that the TR value actually reaches one of the thresholds TH_H or TH_L. Such occurrence is rare and is easily handled by the control loop. If an error condition is detected by the software 112, it may take remedial action and may simply reset the ADPLL 108 for continued operation. Otherwise during normal CM mode, operation loops back to block 1020 and operation loops between blocks 1020 and 1022 during normal CM operating mode. When the software 112 indicates the SM mode after the CM mode is completed as determined at block 1020, operation loops back to block 1010 in which the tracking thresholds TH_H and TH_L are reset back to the narrow mode for the SM operating mode.

Figure 11:
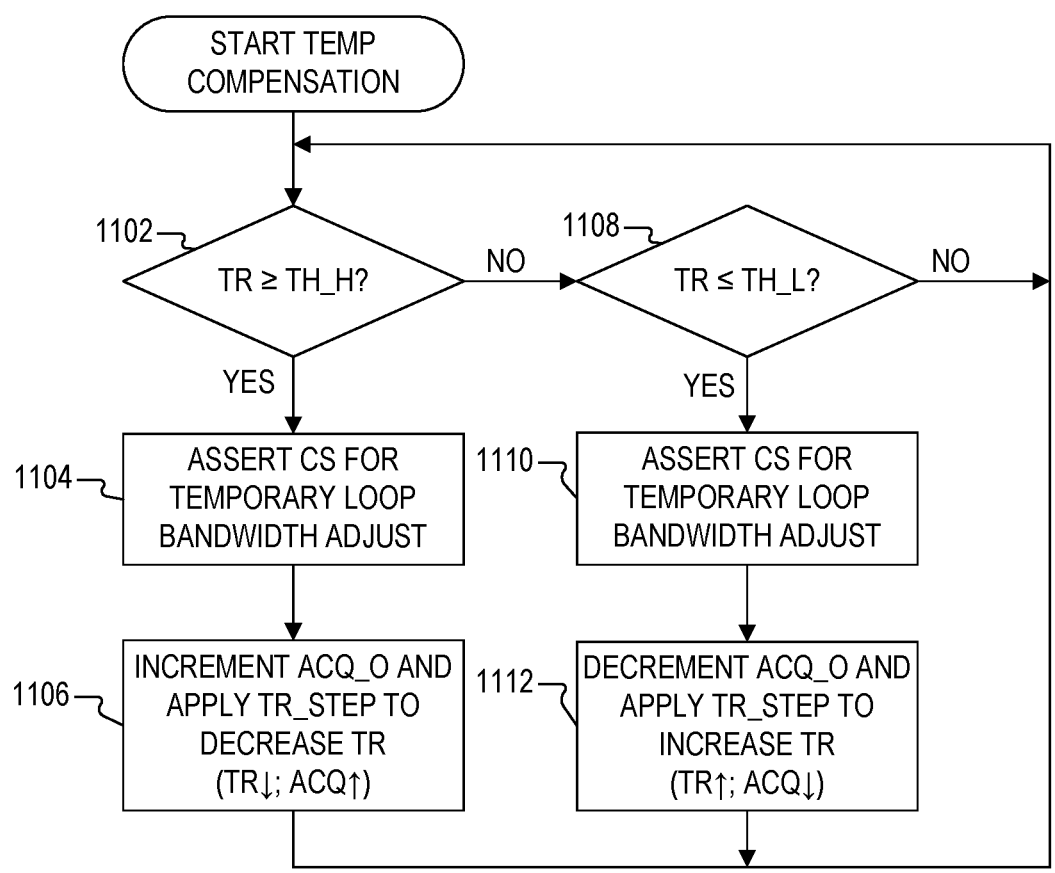
FIG. 11 is a simplified flowchart illustrating operation of the temperature compensation circuitry of FIG. 2 for adjusting the ACQ and TR values in a complementary manner while the TR filter is adjusting the TR value in response to changes of phase error signal PHE and temperature according to one embodiment of the present disclosure.

FIG. 11 is a simplified flowchart illustrating operation of the temperature compensation circuitry 212 for adjusting the ACQ and TR values in a complementary manner while the TR filter 226 is adjusting the TR value in response to changes of phase error signal PHE and temperature according to one embodiment of the present disclosure. TR tracking applies for both SM and CM modes of operation, although compensation steps may be minimized during the CM mode. At block 1102, it is queried whether the TR value is greater than or equal to the upper threshold TH_H. If so, operation advances to block 1104 in which the temperature compensation circuitry 212 asserts the CS signal for a temporary loop bandwidth adjust as shown and described in FIG. 8. Operation then advances to block 1106 in which the temperature compensation circuitry 212 increments ACQ_O to increment ACQ and applies TR_STEP to decrease the TR value by a complementary amount to maintain frequency and lock. Operation then loops back to block 1102. At block 1102, if TR is not greater than or equal to TH_H, then operation advances instead to block 1108 in which it is queried whether TR is less than or equal to the low threshold TH_L. If so, operation advances to block 1110 in which the temperature compensation circuitry 212 asserts the CS signal for a temporary loop bandwidth adjust as shown and described in FIG. 8. Operation then advances to block 1112 in which the temperature compensation circuitry 212 decrements ACQ_O to decrement ACQ and applies TR_STEP to increase the TR value by a complementary amount to maintain frequency and lock. Operation then loops back to block 1102 and operation continues in this manner during TR tracking mode.

The present disclosure generally describes a control system of a digitally controlled oscillator (DCO) with temperature compensation that substantially avoids temperature compensation steps during a critical mode of operation. Filter circuitry within a control loop uses an error value (e.g., PHE) provided by a loop detector to determine a lower resolution digital value which is a first portion of a digital control value provided to the DCO. The PVT and ACQ values, for example, may collectively form the lower resolution digital value so that the DCO generates an output oscillation signal (e.g., OSC) at a frequency based on the frequency control value (e.g., FCW) within a lower resolution range. A second portion of the digital control value provided to the DCO is a tracking digital value (e.g., the TR value) for controlling the frequency of OSC within a higher resolution range. Tracking circuitry (e.g., TR filter 226) initially holds the tracking digital value at an asymmetric tracking offset (e.g., TR_OFFSET) from a center of a predetermined tracking range while the lower resolution value (e.g., PVT and ACQ) is being determined, and then the tracking circuitry is released to regulate the frequency of the output oscillation signal based on the error value within a higher resolution range by adjusting the tracking digital value. As shown and described with reference to FIG. 2, for example, the controller 214 switches the TR MODE signal so that the MUX 238 switches from the TR_OFFSET to insert the TR filter 226 within the control loop of the system (e.g., the ADPLL 108).

Temperature compensation circuitry (e.g., 212) adjusts the lower resolution digital value (e.g., such by adjusting ACQ) and the tracking digital value (e.g., TR) in a complementary manner for each temperature compensation step to maintain the tracking digital value between a first threshold and a second threshold within the predetermined tracking range (meaning, the overall range of the TR value). Such configuration avoids the predetermined tracking range from having to cover the whole temperature range (such as the entire temperature range shown in FIG. 3). In the illustrated embodiment, the lower resolution digital value may initially be determined (during lock) by ACQ_I, and then may be adjusted with an offset, such as incrementing or decrementing ACQ_O provided to the adder 206 receiving ACQ_I and providing ACQ. Complementary adjustment means that when the lower resolution digital value is increased (e.g., by incrementing ACQ), the tracking digital value is decreased by TR_STEP, and vice-versa. As previously described, in one embodiment one ACQ step is equivalent to M steps of TR, so that TR_STEP may have a magnitude of M. In that case, such complementary adjustment may be configured so that the overall digital control value (e.g., 250, including PVT, ACQ, and TR) remains unmodified.

A controller (e.g., 214) may be configured to set the first threshold and the second threshold within a narrow range around the tracking offset during a standard operating mode, and to adjust at least one of the first and second thresholds within a wide range of the predetermined tracking range during a critical operating mode (e.g., CM). In one embodiment, the first threshold may be a lower threshold (e.g., TH_L) and the second threshold may be a higher threshold (e.g., TH_H). The narrow range may be a relatively tight range above and below the tracking offset during the standard operating mode (e.g., SM), such as shown in FIG. 6, so that TR does not significantly deviate from the tracking offset during the standard operating mode. Such narrow range may cause a significant number of temperature compensation steps during the standard operating mode. Although complementary adjustment may minimize adjustment of the digital control value, each temperature compensation step resulting in complementary adjustment of the lower resolution digital value and the tracking digital causes a frequency or phase glitch. Such glitches are tolerated during the standard operating mode, but are not desired during the critical operating mode.

When the critical operating mode is indicated, such as by system software or the like (e.g., 112), one or both of the first and second thresholds may be adjusted within a wide range so that TR may deviate within the wide range without causing a temperature compensation step. For example, the first threshold (e.g., TH_L) may be decreased and/or the second threshold (e.g., TH_H) may be increased such as shown in FIG. 6, so that TR has plenty of room for adjustment during critical mode without encountering the thresholds thereby avoiding or at least minimizing temperature compensation steps. In the general case, the first and second thresholds are both adjusted to within margins at either end of the predetermined tracking range to optimize performance by minimizing temperature compensation steps.

In one illustrated embodiment such as shown in FIG. 6, the tracking digital value may be a signed value in which the predetermined tracking range ranges from a negative minimum value (TR_MIN) to a maximum positive value (MAX) centered at zero. An example is shown in FIGS. 6 and 7 in which TR_MIN is −400 and TR_MAX is +400, although these are arbitrary values for a specific configuration. However, the tracking digital value may be unsigned in which the predetermined tracking range may range from a minimum value to a maximum value, or more generally, from a first end to a second end on either side of a center value. An unsigned example is not specifically shown, but could be a digital value that ranges from 0 to 256, or 0 to 512, etc. The tracking offset may be selected to asymmetrically position the tracking digital value towards the first end when expected temperature change during the standard operating mode is expected to cause the tracking circuitry to adjust the digital control value towards the second end of the predetermined tracking range. As shown in FIG. 6, for example, TR is initially set to TR_OFFSET at a negative value below the center zero value, in which it is expected that TR increases in the positive direction in response to increasing temperature. Yet if temperature is expected to cool down, TR_OFFSET may be set in the positive range, or, more generally, towards the second end of the predetermined tracking range.

System software may be used to anticipate and provide a mode signal (e.g., OP MODE) to the controller indicating either one of the standard operating mode or the critical operating mode. The controller responsively adjusts one or both of the first and second thresholds. The control system may include an integrator configured to develop the reference value based on the frequency control value (e.g., FCW) and a reference clock, and a frequency divider (e.g., 210) having an input receiving the output oscillation signal and an output providing the feedback value to the loop detector. The tracking circuitry may receive at least one loop control parameter that sets a bandwidth range, where the control system may include bandwidth control circuitry (e.g., 800) that temporarily adjusts at least one loop control parameter to widen bandwidth during each temperature compensation step.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A control system for a digitally controlled oscillator (DCO) with temperature compensation, comprising:
   a loop detector configured to compare a feedback value with a reference value based on a frequency control value and to provide an error value;
   filter circuitry configured to use the error value to determine a lower resolution digital value comprising a first portion of a digital control value provided to the DCO to generate an output oscillation signal at a frequency based on the frequency control value within a lower resolution range;
   tracking circuitry configured to hold a tracking digital value comprising a second portion of the digital control value at a tracking offset from a center of a predetermined tracking range while the lower resolution digital value is being determined, and then to regulate the frequency of the output oscillation signal based on the error value within a higher resolution range by adjusting the tracking digital value;
   temperature compensation circuitry configured to adjust the lower resolution digital value and the tracking digital value in a complementary manner for each temperature compensation step to maintain the tracking digital value between a first threshold and a second threshold within the predetermined tracking range; and
   a controller configured to set the first threshold and the second threshold within a narrow range around the tracking offset during a standard operating mode, and to adjust at least one of the first and second thresholds within a wide range of the predetermined tracking range during a critical operating mode, wherein the temperature compensation circuitry is configured to perform each temperature compensation step by incrementally adjusting the lower resolution digital value and by simultaneously applying a predetermined tracking step to the tracking digital value to maintain the tracking digital value between the first and second thresholds.

2. The control system of claim 1, wherein the temperature compensation circuitry is configured to perform each temperature compensation step by incrementing the low resolution digital value and decreasing the tracking digital value by the tracking step when the tracking digital value reaches the second threshold, and by decrementing the low resolution digital value and increasing the tracking digital value by the tracking step when the tracking digital value reaches the first threshold.

3. The control system of claim 1, wherein the temperature compensation circuitry is configured to adjust the lower resolution digital value and the tracking digital value in a complementary manner so that the digital control value remains unmodified for each temperature compensation step.

4. The control system of claim 1, wherein the wide range of the predetermined tracking range is sufficient to allow the tracking circuitry to adjust the tracking digital value to regulate the frequency of the output oscillation signal with minimal adjustments of the lower resolution digital value while temperature changes.

5. The control system of claim 1, wherein the predetermined tracking range ranges from a first end to a second end on either side of the center, and wherein the tracking offset is selected to position the tracking digital value towards the first end when expected temperature change during the standard operating mode is expected to cause the tracking circuitry to adjust the digital control value towards the second end of the predetermined tracking range.

6. The control system of claim 5, wherein the first threshold is positioned between the tracking offset and the first end and the second threshold is positioned between the tracking offset and the center of the predetermined tracking range when set within the narrow range during the standard operating mode.

7. The control system of claim 6, wherein the first and second thresholds when set within the narrow range are separated at least by a tracking step used to adjust the tracking digital value for each temperature compensation step.

8. The control system of claim 5, wherein the second threshold is adjusted to a position between the center and the second end of the predetermined tracking range during the critical operating mode.

9. The control system of claim 8, wherein the first threshold is adjusted to a position closer to the first end of the predetermined tracking range during the critical operating mode.

10. The control system of claim 1, further comprising system software that is configured to provide a mode signal indicative of the operating mode to the controller including the standard operating mode and the critical operating mode.

11. The control system of claim 1, further comprising an integrator configured to develop the reference value based on the frequency control value and a reference clock, and a frequency divider having an input receiving the output oscillation signal and an output providing the feedback value.

12. The control system of claim 1, wherein the filter circuitry comprises coarse filter circuitry configured to provide most significant bits of the low resolution digital value to compensate for process, voltage, and initial temperature, and acquisition filter circuitry comprising intermediate filter circuitry configured to provide intermediate significant bits of the low resolution digital value.

13. The control system of claim 1, wherein the tracking circuitry receives at least one loop control parameter that sets a bandwidth range, further comprising bandwidth control circuitry that temporarily adjusts the at least one loop control parameter to widen bandwidth during each temperature compensation step.

14. A method of controlling a digitally controlled oscillator (DCO) with temperature compensation, comprising:
   comparing a feedback value with a reference value based on a frequency control value and providing an error value;
   using the error value to determine a lower resolution digital value comprising a first portion of a digital control value provided to the DCO to generate an output oscillation signal at a frequency based on the frequency control value within a lower resolution range;
   holding a tracking digital value comprising a second portion of the digital control value at a tracking offset from a center of a predetermined tracking range while the lower resolution digital value is being determined, and then regulating the frequency of the output oscillation signal based on the error value within a higher resolution range by adjusting the tracking digital value;
   adjusting the lower resolution digital value and the tracking digital value in a complementary manner for each temperature compensation step to maintain the tracking digital value between a first threshold and a second threshold within the predetermined tracking range; and
   setting the first threshold and the second threshold within a narrow range around the tracking offset during a standard operating mode; and
   adjusting at least one of the first and second thresholds within a wide range of the predetermined tracking range during a critical operating mode, wherein adjusting the lower resolution digital value and the tracking digital value in a complementary manner comprises incrementally adjusting the lower resolution digital value and simultaneously applying a predetermined tracking step to the tracking digital value to maintain the tracking digital value between the first and second thresholds.

15. The method of claim 14, wherein the adjusting the lower resolution digital value and the tracking digital value in a complementary manner comprises adjusting the lower resolution digital value and the tracking digital value in a complementary manner so that the digital control value remains unmodified for each temperature compensation step.

16. The method of claim 14, wherein the predetermined tracking range ranges from a first end to a second end on either side of the center, further comprising:
   selecting the tracking offset to position the tracking digital value towards the first end during the standard operating mode;
   positioning the first threshold between the tracking offset and the first end of the predetermined tracking range and positioning the second threshold between the tracking offset and the center of the predetermined tracking range when set within the narrow range during the standard operating mode; and
   adjusting the second threshold to a position between the center and the second end of the predetermined tracking range during the critical operating mode.

17. The method of claim 16, further comprising adjusting the first threshold to a position closer to the first end of the predetermined tracking range during the critical operating mode.

18. The method of claim 14, further comprising temporarily adjusting at least one loop control parameter to increase bandwidth during each temperature compensation step.

19. A control system for a digitally controlled oscillator (DCO) with temperature compensation, comprising:
   a loop detector configured to compare a feedback value with a reference value based on a frequency control value and to provide an error value;
   filter circuitry configured to use the error value to determine a lower resolution digital value comprising a first portion of a digital control value provided to the DCO to generate an output oscillation signal at a frequency based on the frequency control value within a lower resolution range;
   tracking circuitry configured to hold a tracking digital value comprising a second portion of the digital control value at a tracking offset from a center of a predetermined tracking range while the lower resolution digital value is being determined, and then to regulate the frequency of the output oscillation signal based on the error value within a higher resolution range by adjusting the tracking digital value;
   temperature compensation circuitry configured to adjust the lower resolution digital value and the tracking digital value in a complementary manner for each temperature compensation step to maintain the tracking digital value between a first threshold and a second threshold within the predetermined tracking range; and
   a controller configured to set the first threshold and the second threshold within a narrow range around the tracking offset during a standard operating mode, and to adjust at least one of the first and second thresholds within a wide range of the predetermined tracking range during a critical operating mode, wherein the predetermined tracking range ranges from a first end to a second end on either side of the center, and wherein the tracking offset is selected to position the tracking digital value towards the first end when expected temperature change during the standard operating mode is expected to cause the tracking circuitry to adjust the digital control value towards the second end of the predetermined tracking range.

* * * * *